US009990970B2

(12) United States Patent
Kim et al.

(10) Patent No.: US 9,990,970 B2
(45) Date of Patent: Jun. 5, 2018

(54) SEMICONDUCTOR DEVICE

(71) Applicant: SK hynix Inc., Icheon-si, Gyeonggi-do (KR)

(72) Inventors: Chang Hyun Kim, Icheon-si (KR); Min Chang Kim, Icheon-si (KR); Do Yun Lee, Icheon-si (KR); Jae Jin Lee, Icheon-si (KR); Hun Sam Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/599,041

(22) Filed: May 18, 2017

(65) Prior Publication Data

US 2017/0256294 A1    Sep. 7, 2017

Related U.S. Application Data

(62) Division of application No. 15/184,064, filed on Jun. 16, 2016, now Pat. No. 9,711,195.

(30) Foreign Application Priority Data

Jan. 19, 2016    (KR) ........................ 10-2016-0006435

(51) Int. Cl.
| | | |
|---|---|---|
| *G11C 7/22* | (2006.01) | |
| *G11C 7/10* | (2006.01) | |
| *G11C 11/4076* | (2006.01) | |
| *G11C 8/18* | (2006.01) | |
| *G11C 8/06* | (2006.01) | |
| *G11C 8/12* | (2006.01) | |
| *G11C 5/06* | (2006.01) | |
| *G11C 8/10* | (2006.01) | |
| *G11C 29/02* | (2006.01) | |
| *G11C 11/419* | (2006.01) | |
| *G11C 7/08* | (2006.01) | |

(52) U.S. Cl.
CPC ................ *G11C 7/109* (2013.01); *G11C 5/06* (2013.01); *G11C 7/22* (2013.01); *G11C 8/06* (2013.01); *G11C 8/10* (2013.01); *G11C 7/08* (2013.01); *G11C 7/222* (2013.01); *G11C 8/12* (2013.01); *G11C 8/18* (2013.01); *G11C 11/4076* (2013.01); *G11C 11/419* (2013.01); *G11C 29/023* (2013.01)

(58) Field of Classification Search
CPC .. G11C 7/109; G11C 5/06; G11C 7/22; G11C 8/06; G11C 8/10; G11C 7/08; G11C 7/222; G11C 8/12; G11C 8/18; G11C 11/4076; G11C 11/409; G11C 29/023
USPC .......................... 365/191, 194, 189.05, 233.1
See application file for complete search history.

(56) References Cited

U.S. PATENT DOCUMENTS

| | | |
|---|---|---|
| 6,272,056 B1 | 8/2001 | Ooishi |
| 6,335,873 B1 | 1/2002 | Kawaguchi et al. |
| 9,324,380 B2 | 4/2016 | Byeon et al. |

(Continued)

FOREIGN PATENT DOCUMENTS

KR    1020150106024 A    9/2015

*Primary Examiner* — Ly D Pham
(74) *Attorney, Agent, or Firm* — William Park & Associates Ltd.

(57) ABSTRACT

A semiconductor device may be provided. The semiconductor device may include a first chip and a second chip. The second chip may be configured to receive signals from the first chip to generate a latch address based on the received signals from the first chip.

5 Claims, 3 Drawing Sheets

(56) References Cited

U.S. PATENT DOCUMENTS

2009/0323436 A1   12/2009  Lee
2015/0041989 A1    2/2015  Lee
2015/0155023 A1*  6/2015  Lee .......................... G11C 8/18
                                                               365/230.06

* cited by examiner

SEMICONDUCTOR DEVICE

CROSS-REFERENCES TO RELATED APPLICATION

The present application is a divisional application of U.S. application Ser. No. 15/184,064, filed on Jun. 16, 2016, and claims priority under 35 U.S.C. § 119(a) to Korean application number 10-2016-0006435, filed on Jan. 19, 2016, in the Korean Intellectual Property Office, which is incorporated herein by reference in its entirety.

BACKGROUND

1. Technical Field

Various embodiments may generally relate to a semiconductor integrated circuit, and more particularly, to a semiconductor device.

2. Related Art

In order to provide a semiconductor device with a massive storage capacity, the semiconductor device may include stacked chips. It may be required to reduce a power consumption of the semiconductor device including these stacked chips.

SUMMARY

According to an embodiment, there may be provided a semiconductor device. The semiconductor device may include an external signal-inputting circuit, a plurality of first signal-transmitting circuit, a command-delaying circuit, a second signal-transmitting circuit and an address-latching circuit. The external signal-inputting circuit may be configured to receive an external clock, an external command and an external address. The first signal-transmitting circuit may be configured to output signals outputted from the external signal-inputting circuit as an internal clock, an internal command and an internal address. The command-delaying circuit may be configured to delay the internal command for a period of the internal clock and to output the delayed internal command. The second signal-transmitting circuit may be configured to output a signal outputted from the command-delaying circuit as a delay command based on a master enabling signal. The address-latching circuit may be configured to latch the internal address based on the internal command and to output a latched signal as a latch address based on the delay command.

According to an embodiment, there may be provided a semiconductor device. The semiconductor device may include a first chip and a second chip. The second chip may be configured to receive signals from the first chip to generate a latch address based on the received signals from the first chip.

DETAILED DESCRIPTION

Figure 1:
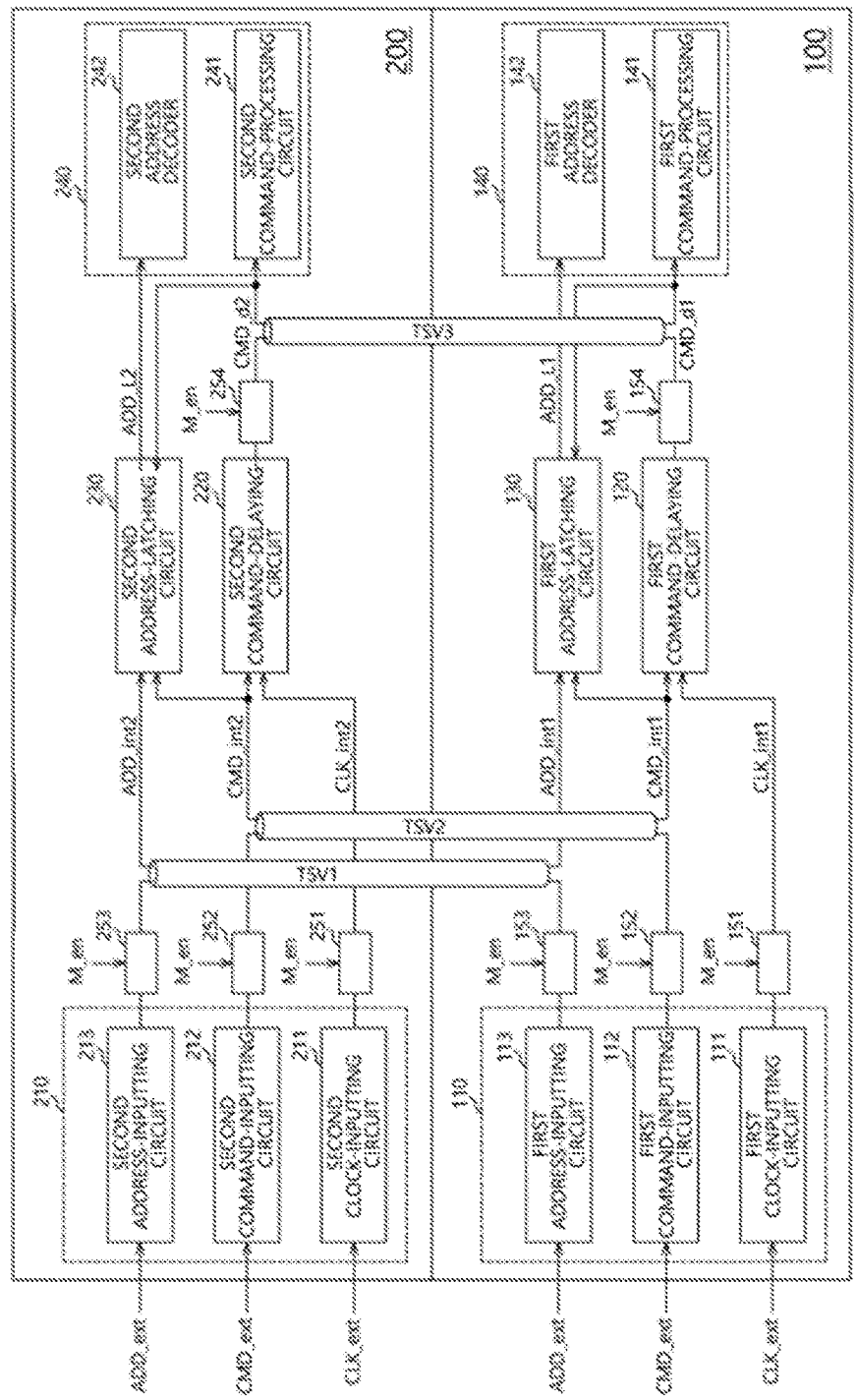
FIG. 1 is a block diagram illustrating a representation of an example of a semiconductor device in accordance with examples of embodiments.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIG. 1 is a block diagram illustrating a representation of an example of a semiconductor device in accordance with examples of embodiments.

Referring to FIG. 1, a semiconductor device of this example of an embodiment may include a first chip 100 and a second chip 200. The first chip 100 and the second chip 200 may be electrically connected with each other via through silicon vias (TSV).

The first chip 100 may include a first external signal-inputting circuit 110, a first command-delaying circuit 120, a first address-latching circuit 130, a first internal signal-processing circuit 140, a first signal-transmitting circuit 151, a second signal-transmitting circuit 152, a third signal-transmitting circuit 153 and a fourth signal-transmitting circuit 154.

The first external signal-inputting circuit 110 may receive external control signals inputted from an external device such as a controller. The first external signal-inputting circuit 110 may transmit the external control signals into the semiconductor device. The external control signals may include an external address ADD_ext, an external command CMD_ext, an external clock CLK_ext, etc.

The first external signal-inputting circuit 110 may include a first clock-inputting circuit 111, a first command-inputting circuit 112 and a first address-inputting circuit 113, etc.

The first clock-inputting circuit 111 may receive and buffer the external clock CLK_ext. The first clock-inputting circuit 111 may output the buffered external clock CLK_ext into the first chip 100. The first clock-inputting circuit 111 may include a clock buffer.

The first command-inputting circuit 112 may receive, buffer and decode the external command CMD_ext. The first command-inputting circuit 112 may output the decoded external command CMD_ext into the first chip 100. The first command-inputting circuit 112 may include a command buffer and a command decoder.

The first address-inputting circuit 113 may receive and buffer the external address ADD_ext. The first address-inputting circuit 113 may output the buffered external address ADD_ext into the first chip 100.

The first command-delaying circuit 120 may delay a first internal command CMD_int1. The first command-delaying circuit 120 may output the delayed first internal command CMD_int1. For example, the first command-delaying circuit 120 may delay the first internal command CMD_int1 for a predetermined period of a first internal clock CLK_int1.

The first address-latching circuit 130 may latch a first internal address ADD_int1 in response to the first internal command CMD_int1 and a first delay command CMD_d1. The first address-latching circuit 130 may output the latched signal as a first latch address ADD_L1. For example, the first address-latching circuit 130 may latch the first internal address ADD_int1 in response to the first internal command CMD_int1. The first address-latching circuit 130 may output the latched signal as the first latch address ADD_L1 in response to the first delay command CMD_d1.

The first internal signal-processing circuit 140 may generate signals for operating the first chip 100 in response to the first latch address ADD_L1 and the first delay command CMD_d1. For example, the first internal signal-processing circuit 140 may decode the first latch address ADD_L1 to generate an address-decoding signal for designating positions of circuits, for example, positions in a data storage region through which data may be transmitted. The first internal signal-processing circuit 140 may decode the first delay command CMD_d1 to generate control signals for operating the first chip 100 such as a read operation, a write operation, a refresh operations, etc.

The first internal signal-processing circuit 140 may include a first command-processing circuit 141 and a first address decoder 142.

The first command-processing circuit 141 may generate the control signals for operating the first chip 100 in response to the first delay command CMD_d1.

The first address decoder 142 may decode the first latch address ADD_L1 to set the positions of the data storage region through which the data may be transmitted.

The first signal-transmitting circuit 151 may output a signal outputted from the first clock-inputting circuit 111 as the first internal clock CLK_int1 in response to a master enabling signal M_en. For example, when the mask enabling signal M_en is enabled, the first signal-transmitting circuit 151 may output the signal from the first clock-inputting circuit 111 as the first internal clock CLK_int1. When the master enabling signal M_en is disabled, the first signal-transmitting circuit 151 may block the signal from the first clock-inputting circuit 111 as the first internal clock CLK_int1.

The second signal-transmitting circuit 152 may output a signal outputted from the first command-inputting circuit 112 as the first internal command CMD_int1 in response to the master enabling signal M_en. For example, when the mask enabling signal M_en is enabled, the second signal-transmitting circuit 152 may output the signal from the first command-inputting circuit 112 as the first internal command CMD_int1. When the master enabling signal M_en is disabled, the second signal-transmitting circuit 152 may block the signal from the first command-inputting circuit 112 as the first internal command CMD_int1.

The third signal-transmitting circuit 153 may output a signal outputted from the first address-inputting circuit 113 as the first internal address ADD_int1 in response to the master enabling signal M_en. For example, when the mask enabling signal M_en is enabled, the third signal-transmitting circuit 153 may output the signal from the first address-inputting circuit 113 as the first internal address ADD_int1. When the master enabling signal M_en is disabled, the third signal-transmitting circuit 153 may block the signal from the first address-inputting circuit 113 as the first internal address ADD_int1.

The fourth signal-transmitting circuit 154 may output a signal outputted from the first command-delaying circuit 120 as the first delay command CMD_d1 in response to the master enabling signal M_en. For example, when the mask enabling signal M_en is enabled, the fourth signal-transmitting circuit 154 may output the signal from the first command-delaying circuit 120 as the first delay command CMD_d1. When the master enabling signal M_en is disabled, the fourth signal-transmitting circuit 154 may block the signal from the first command-delaying circuit 120 as the first delay command CMD_d1.

The second chip 200 may be stacked on the first chip 100. The first chip 100 and the second chip 200 may be electrically connected with each other through first to third TSVs TSV1, TSV2 and TSV3. The first TSV TSV1 may output the first internal address ADD_int1 of the first chip 100 as a second internal address ADD_int2 of the second chip 200. The second TSV TSV2 may output the first internal command CMD_int1 of the first chip 100 as a second internal command CMD_int2 of the second chip 200. The third TSV TSV3 may output the first delay command CMD_d1 of the first chip 100 as a second delay command CMD_d2.

The second chip 200 may include a second external signal-inputting circuit 210, a second command-delaying circuit 220, a second address-latching circuit 230, a second internal signal-processing circuit 240, a fifth signal-transmitting circuit 251, a sixth signal-transmitting circuit 252, a seventh signal-transmitting circuit 253 and an eighth signal-transmitting circuit 254.

The second external signal-inputting circuit 210 may receive external control signals inputted from an external device such as a controller. The second external signal-inputting circuit 210 may transmit the external control signals into the semiconductor device. The external control signals may include an external address ADD_ext, an external command CMD_ext, an external clock CLK_ext, etc.

The second external signal-inputting circuit 210 may include a second clock-inputting circuit 211, a second command-inputting circuit 212 and a second address-inputting circuit 213, etc.

The second clock-inputting circuit 211 may receive and buffer the external clock CLK_ext. The second clock-inputting circuit 211 may output the buffered external clock CLK_ext into the second chip 200. The second clock-inputting circuit 211 may include a clock buffer.

The second command-inputting circuit 212 may receive, buffer and decode the external command CMD_ext. The second command-inputting circuit 212 may output the decoded external command CMD_ext into the second chip 200. The second command-inputting circuit 212 may include a command buffer and a command decoder.

The second address-inputting circuit 213 may receive and buffer the external address ADD_ext. The second address-inputting circuit 213 may output the buffered external address ADD_ext into the second chip 200.

The second command-delaying circuit 220 may delay a second internal command CMD_int2. The second command-delaying circuit 220 may output the delayed second internal command CMD_int2. For example, the second command-delaying circuit 220 may delay the second internal command CMD_int2 for a predetermined period of a second internal clock CLK_int2.

The second address-latching circuit 230 may latch a second internal address ADD_int2 in response to the second internal command CMD_int2 and a second delay command CMD_d2. The second address-latching circuit 230 may output the latched signal as a second latch address ADD_L2. For example, the second address-latching circuit 230 may latch the second internal address ADD_int2 in response to the second internal command CMD_int2. The second address-latching circuit 230 may output the latched signal as the second latch address ADD_L2 in response to the second delay command CMD_d2.

The second internal signal-processing circuit 240 may generate signals for operating the second chip 200 in response to the second latch address ADD_L2 and the second delay command CMD_d2. For example, the second internal signal-processing circuit 240 may decode the second latch address ADD_L2 to generate an address-decoding signal for designating positions of circuits, for example, positions in a data storage region through which data may be transmitted. The second internal signal-processing circuit 240 may decode the second delay command CMD_d2 to generate control signals for operating the second chip 200 such as a read operation, a write operation, a refresh operations, etc.

The second internal signal-processing circuit 240 may include a second command-processing circuit 241 and a second address decoder 242.

The second command-processing circuit 241 may generate the control signals for operating the second chip 100 in response to the second delay command CMD_d2.

The second address decoder 242 may decode the second latch address ADD_L2 to set the positions of the data storage region through which the data may be transmitted.

The fifth signal-transmitting circuit 251 may output a signal outputted from the second clock-inputting circuit 211 as the second internal clock CLK_int2 in response to the master enabling signal M_en. For example, when the mask enabling signal M_en is enabled, the fifth signal-transmitting circuit 251 may output the signal from the second clock-inputting circuit 211 as the second internal clock CLK_int2. When the master enabling signal M_en is disabled, the fifth signal-transmitting circuit 251 may block the signal from the second clock-inputting circuit 211 as the second internal clock CLK_int2.

The sixth signal-transmitting circuit 252 may output a signal outputted from the second command-inputting circuit 212 as the second internal command CMD_int2 in response to the master enabling signal M_en. For example, when the mask enabling signal M_en is enabled, the sixth signal-transmitting circuit 252 may output the signal from the second command-inputting circuit 212 as the second internal command CMD_int2. When the master enabling signal M_en is disabled, the sixth signal-transmitting circuit 252 may block the signal from the second command-inputting circuit 212 as the second internal command CMD_int2.

The seventh signal-transmitting circuit 253 may output a signal outputted from the second address-inputting circuit 213 as the second internal address ADD_int2 in response to the master enabling signal M_en. For example, when the mask enabling signal M_en is enabled, the seventh signal-transmitting circuit 253 may output the signal from the second address-inputting circuit 213 as the second internal address ADD_int2. When the master enabling signal M_en is disabled, the seventh signal-transmitting circuit 253 may block the signal from the second address-inputting circuit 213 as the second internal address ADD_int2.

The eighth signal-transmitting circuit 254 may output a signal outputted from the second command-delaying circuit 220 as the second delay command CMD_d2 in response to the master enabling signal M_en. For example, when the mask enabling signal M_en is enabled, the eighth signal-transmitting circuit 254 may output the signal from the second command-delaying circuit 220 as the second delay command CMD_d2. When the master enabling signal M_en is disabled, the eighth signal-transmitting circuit 254 may block the signal from the second command-delaying circuit 220 as the second delay command CMD_d2.

The first TSV TSV1 may be connected between an output of the third signal-transmitting circuit 153 and an output of the seventh signal-transmitting circuit 253 to output the first internal address ADD_int1 of the first chip 100 as the second internal address ADD_int2 of the second chip 200. The second TSV TSV2 may be connected between an output of the second signal-transmitting circuit 152 and an output of the sixth signal-transmitting circuit 252 to output the first internal command CMD_int1 of the first chip 100 as the second internal command CMD_int2 of the second chip 200. The third TSV TSV3 may be connected between an output of the fourth signal-transmitting circuit 154 and an output of the eighth signal-transmitting circuit 254 to output the first delay command CMD_d1 of the first chip 100 as the second delay command CMD_d2 of the second chip 200.

The first to eighth signal-transmitting circuits 151, 152, 153, 154, 251, 252, 253 and 254 may output or not output the signals inputted therein in response to the master enabling signal M_en. The first to eighth signal-transmitting circuits 151, 152, 153, 154, 251, 252, 253 and 254 may include substantially the same configuration except for the input signals.

Figure 2:
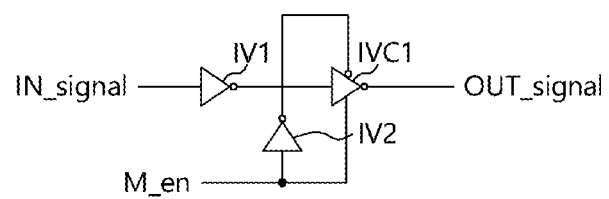
FIG. 2 is a circuit diagram illustrating a representation of an example of a signal-transmitting circuit of a semiconductor device associated with FIG. 1.

FIG. 2 is a circuit diagram illustrating a representation of an example of a signal-transmitting circuit of a semiconductor device associated with FIG. 1.

Referring to FIG. 2, each of the first to eighth signal-transmitting circuits 151, 152, 153, 154, 251, 252, 253 and 254 may include a first inverter IV1, a second inverter IV2 and a control inverter IVC1.

The first inverter IV1 may receive an input signal IN_signal. The second inverter IV2 may receive the master enabling signal M_en. The control inverter IVC1 may include a first control terminal into which an output signal from the second inverter IV2 may be inputted, a second control terminal into which the master enabling signal M_en may be inputted, and an output terminal through which an output signal OUT_signal may be outputted.

Hereinafter, operations of the first signal-transmitting circuit 151 may be explained, for example, with reference to FIG. 2. Each of the first to eighth signal-transmitting circuits 151, 152, 153, 154, 251, 252, 253 and 254 may have substantially the same or same configurations as the first signal-transmitting circuit except input and output signals thereof.

When the master enabling signal M_en is enabled, the first inverter IV1 may reverse the output signal from the first clock-inputting circuit 111. The first inverter IV1 may output the reversed output signal.

The second inverter IV2 may reverse and output the master enabling signal M_en.

When the reversed master enabling signal M_en is inputted into the first control terminal of the control inverter IVC and the master enabling signal M_en is inputted into the second control terminal of the control inverter IVC, the control inverter IVC may be activated. The activated control inverter IVC may reverse the output signal from the first inverter IV1. The activated control inverter IVC may output the reserved output signal as the first internal clock CLK_int1.

As a result, when the master enabling signal M_en is enabled, the first signal-transmitting circuit 151 may be activated. The activated first signal-transmitting circuit 151 may output the output signal from the first clock-inputting circuit 111 as the first internal clock CLK_int1.

When the master enabling signal M_en is disabled, the disabled master enabling signal M_en may be inputted into the first and second control terminals of the control inverter IVC so that the control inverter IVC may be inactivated. The inactivated control inverter IVC may block the output signal from the first inverter IV1 as the first internal clock CLK_int1.

Hereinafter, operations of the semiconductor device in accordance with examples of embodiments may be discussed below.

The second chip 200 may be stacked on the first chip 100. The first chip 100 may be operated as a master chip. The second chip 200 may be operated as a slave chip. The first chip 100 may be connected with the controller to transmit the control signals of the controller to the first and second chip 100 and 200. The master enabling signal M_en of the first chip 100 as the master chip may be enabled. The master enabling signal M_en of the second chip 200 as the slave chip may be disabled.

The enabled master enabling signal M_en may be provided to the first chip 100. The disabled mater enabling signal M_en may be provided to the second chip 200.

The first chip 100 as the master chip may receive the control signals from the controller such as the external address ADD_ext, the external command CMD_ext and the external clock CLK_ext. Internal operations of the first chip 100 may be discussed below.

The first clock-inputting circuit 111 may buffer the external clock CLK_ext. The first clock-inputting circuit 111 may output the buffered external clock CLK_ext.

The first command-inputting circuit 112 may buffer and decode the external command CMD_ext. The first command-inputting circuit 112 may output the buffered and decoded external command CMD_ext.

The first address-inputting circuit 113 may buffer the external address ADD_ext. The first address-inputting circuit 113 may output the buffered external address ADD_ext.

When the enabled master enabling signal M_en is provided to the first signal-transmitting circuit 151, the first signal-transmitting circuit 151 may output the output signal from the first clock-inputting circuit 111 as the first internal clock CLK_int1.

When the enabled master enabling signal M_en is provided to the second signal-transmitting circuit 152, the second signal-transmitting circuit 152 may output the output signal from the first command-inputting circuit 112 as the first internal command CMD_int1.

When the enabled master enabling signal M_en is provided to the third signal-transmitting circuit 153, the third signal-transmitting circuit 153 may output the output signal from the first address-inputting circuit 113 as the first internal address ADD_int1.

The first command-delaying circuit 120 may delay the first internal command CMD_int1 for the period of the first internal clock CLK_int1.

When the enabled master enabling signal M_en is provided to the fourth signal-transmitting circuit 154, the fourth signal-transmitting circuit 154 may output the output signal from the first command-delaying circuit 120 as the first delay command CMD_d1.

The first address-latching circuit 130 may latch the first internal address ADD_int1 in response to the first internal command CMD_int1. The first address-latching circuit 130 may output the latched signal as the first latch address ADD_L1 in response to the first delay command CMD_L1.

The first command-processing circuit 141 may be operated in response to the first delay command CMD_d1.

The first address decoder 142 may decode the first latch address ADD_L1.

Internal operations of the second chip 200 to which the disabled master enabling signal M_en is provided may be discussed below.

The external clock CLK_ext, the external command CMD_ext and the external address ADD_ext may not be inputted into the second chip 200 as the slave chip.

When the disabled master enabling signal M_en may be inputted into the fifth to eighth signal-transmitting circuits 251, 252, 253 and 254, the fifth to eighth signal-transmitting circuits 251, 252, 253 and 254 may be inactivated.

The inactivated fifth signal-transmitting circuit 251 may block the output signal from the second clock-inputting circuit 211 as the second internal clock CLK_int2.

The inactivated sixth signal-transmitting circuit 252 may block the output signal from the second command-inputting circuit 212 as the second internal command CMD_int2.

The inactivated seventh signal-transmitting circuit 253 may block the output signal from the second address-inputting circuit 213 as the second internal address ADD_int2.

The inactivated eighth signal-transmitting circuit 254 may block the output signal from the second command-delaying circuit 220 as the second delay command CMD_d2.

The first TSV TSV1 may transmit the first internal address ADD_int1 of the first chip 100 to the second chip 200. The transmitted signal may be outputted from the second chip 200 as the second internal address ADD_int2.

The second TSV TSV2 may transmit the first internal command CMD_int1 of the first chip 100 to the second chip 200. The transmitted signal may be outputted from the second chip 200 as the second internal command CMD_int2.

The third TSV TSV3 may transmit the first delay command CMD_d1 of the first chip 100 to the second chip 200. The transmitted signal may be outputted from the second chip 200 as the second delay command CMD_d2.

The second address-latching circuit 230 of the second chip 200 as the slave chip may receive the second internal address ADD_int2, the second internal command CMD_int2 and the second delay command CMD_d2 through the first to third TSVs TSV1, TSV2 and TSV3.

The second address-latching circuit 230 may latch the second internal address ADD_int2 in response to the second internal command CMD_int2. The second address-latching circuit 230 may output the latched signal as the second latch address ADD_L2 in response to the second delay command CMD_d2.

The second command-processing circuit 241 may be operated in response to the second delay command CMD_d2.

The second address decoder 242 may decode the second latch address ADD_L2.

The second chip 200 as the slave chip may be operated in response to the commands and the addresses transmitted from the first chip 100. Particularly, the second address-latching circuit 230 of the second chip 200 may receive the second internal command CMD_int2, the second internal address ADD_int2 and the second delay command CMD_d2 from the first chip 100. The second address-latching circuit 230 may latch the second internal address ADD_int2 in response to the second internal command CMD_int2. The second address-latching circuit 230 may output the latched signal as the second latch address ADD_L2 in response to the second delay command CMD_d2.

As a result, the second chip 200 may not operate the second command-delaying circuit 220. The second chip 200 may latch the second internal address ADD_int2 in response to the second internal command CMD_int2 from the first chip 100 and output the latched signal as the second latch address ADD_L2 in response to the second delay command CMD_d2 from the first chip 100. The second chip 200 may output the latched signal as the second latch address ADD_L2.

The second command-processing circuit 241 and the second address decoder 242 for operating the second chip 200 may be operated in response to the signals transmitted from the first chip 100 such as the internal command, the internal address and the delay command. The second chip 200 may not operate the second command-delaying circuit 220. The second command-delaying circuit 220 of the second chip 200 may be substituted with the first command-delaying circuit 120 of the first chip 100.

A semiconductor device according to the present invention may comprise: a first chip (100) including a first command-delaying circuit (120) and a first address-latching circuit (130); and a second chip (200) including a second command-delaying circuit (220) and a second address-latching circuit (230), wherein the second address-latching circuit (230) is configured to generate a latch address based on an output signal of the first command-delaying circuit (120) or an output signal of the second command-delaying circuit (220) depending on whether the first chip (100) is operating as a master chip and the second chip (200) is operating as a slave chip or whether the first chip (100) is operating as the slave chip and the second chip (200) is operating as the master chip. The first address-latching circuit (130) is configured to generate a latch address based on an output signal of the second command-delaying circuit (220) or an output signal of the first command-delaying circuit (120) depending on whether the first chip (100) is operating as the master chip and the second chip (200) is operating as the slave chip or whether the first chip (100) is operating as the slave chip and the second chip (200) is operating as the master chip. If the second address-latching circuit (230) generates the latch address based on the output signal of the first command-delaying circuit (120) then the second command-delaying circuit (220) is prevented from operating. If the second address-latching circuit (230) generates the latch address based on the output signal of the first command-delaying circuit (120) then the second command-delaying circuit (220) is prevented from supplying an output signal to the second address-latching circuit (230).

Figure 3:
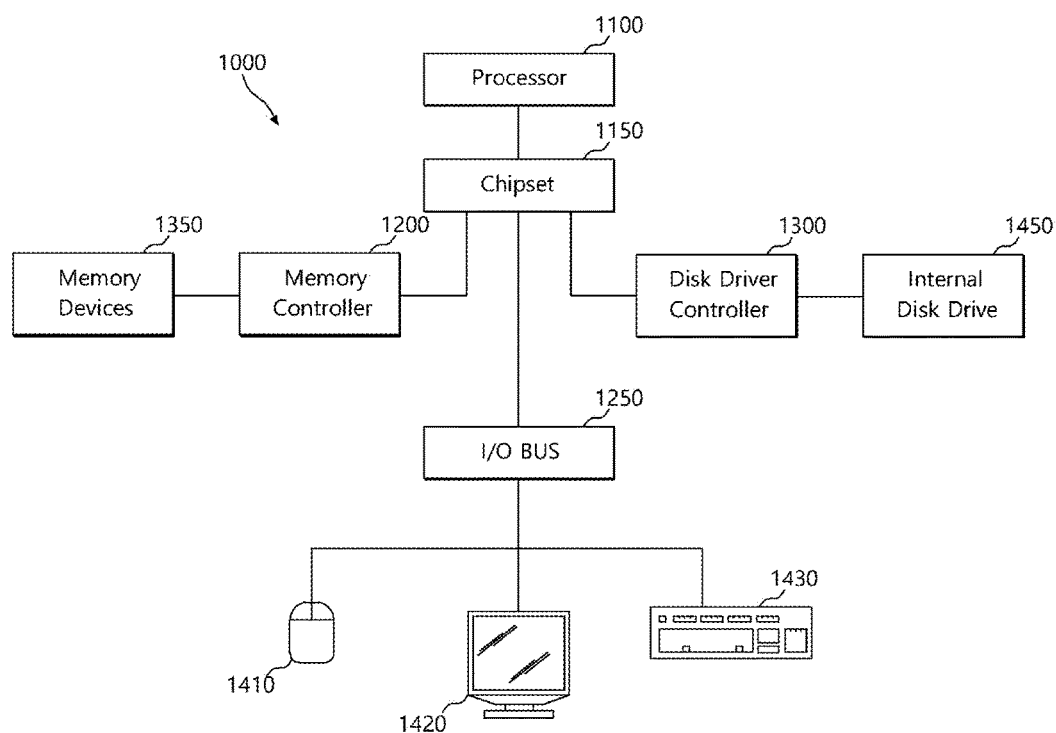
FIG. 3 illustrates a block diagram of an example of a representation of a system employing a semiconductor device with the various embodiments discussed above with relation to FIGS. 1-2.

The semiconductor devices as discussed above (see FIGS. 1-2) are particular useful in the design of memory devices, processors, and computer systems. For example, referring to FIG. 3, a block diagram of a system employing a semiconductor device in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device as discussed above with reference to FIGS. 1-2. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-2, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 3 is merely one example of a semiconductor device as discussed above with relation to FIGS. 1-2. In alternate embodiments, such as, for example but not limited to, cellular phones or digital cameras, the components may differ from the embodiments illustrated in FIG. 3.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor device comprising:
   an external signal-inputting circuit configured to receive and output an external clock, an external command and an external address;
   a plurality of signal-transmitting circuits configured to output signals outputted from the external signal-inputting circuit as an internal clock, an internal command and an internal address based on a master enabling signal;
   a command-delaying circuit configured to delay the internal command for a predetermined period of the internal clock;
   another signal-transmitting circuit configured to output a signal outputted from the command-delaying circuit as a delay command based on the master enabling signal; and
   an address-latching circuit configured to receive the internal command and the delay command, latch the internal address based on the internal command and to output a latched signal as a latch address based on the delay command.

2. The semiconductor device of claim 1, wherein the master enabling signal is enabled when a chip in the semiconductor device is operated as a master chip, and the master enabling signal is disabled when the chip is operated as a slave chip.

3. The semiconductor device of claim 2, wherein the plurality of signal-transmitting circuits output the signals outputted from the external signal-inputting circuit as the internal clock, the internal command and the internal address when the master enabling signal is enabled, and the plurality of signal-transmitting circuits block the signals outputted from the external signal-inputting circuit as the internal clock, the internal command and the internal address when the master enabling signal is disabled.

4. The semiconductor device of claim 2, wherein the another signal-transmitting circuit outputs the signal outputted from the command-delaying circuit as the delay command when the master enabling signal is enabled, and the another signal-transmitting circuit blocks the signal outputted from the command-delaying circuit as the delay command when the master enabling signal is disabled.

5. The semiconductor device of claim 1, further comprising:
   an address decoder configured to decode the latch address; and
   a command-processing circuit operated based on the delay command.

* * * * *